(12) United States Patent
Lai

(10) Patent No.: US 10,416,910 B1
(45) Date of Patent: Sep. 17, 2019

(54) APPARATUS AND METHOD TO REDUCE MEMORY SUBSYSTEM POWER DYNAMICALLY

(71) Applicant: ALTERA CORPORATION, San Jose, CA (US)

(72) Inventor: Siaw Kang Lai, Gelugor (MY)

(73) Assignee: Altera Corporation, San Jose, CA (US)

( * ) Notice: Subject to any disclaimer, the term of this patent is extended or adjusted under 35 U.S.C. 154(b) by 100 days.

(21) Appl. No.: 15/270,515

(22) Filed: Sep. 20, 2016

(51) Int. Cl.
*G06F 3/06* (2006.01)
*G06F 1/32* (2019.01)
*G06F 1/08* (2006.01)
*G06F 1/324* (2019.01)

(52) U.S. Cl.
CPC .............. *G06F 3/0625* (2013.01); *G06F 1/08* (2013.01); *G06F 1/324* (2013.01); *G06F 3/0659* (2013.01); *G06F 3/0671* (2013.01)

(58) Field of Classification Search
CPC .... G06F 3/0625; G06F 3/0659; G06F 3/0671; G06F 1/08; G06F 1/324
See application file for complete search history.

(56) References Cited

U.S. PATENT DOCUMENTS

| | | | |
|---|---|---|---|
| 7,930,469 B2 | 4/2011 | Brittain et al. | |
| 2001/0011356 A1* | 8/2001 | Lee | G06F 1/3203 713/322 |
| 2003/0056057 A1 | 3/2003 | Lawrence | |
| 2008/0219083 A1* | 9/2008 | Chang | G06F 1/3225 365/233.1 |
| 2009/0249169 A1 | 10/2009 | Bains et al. | |
| 2010/0250981 A1 | 9/2010 | Pamley et al. | |
| 2012/0017099 A1 | 1/2012 | David et al. | |
| 2012/0201090 A1 | 8/2012 | Blodgett et al. | |
| 2013/0021072 A1* | 1/2013 | Wang | G06F 1/08 327/145 |
| 2013/0054921 A1 | 2/2013 | Berard et al. | |
| 2013/0166931 A1 | 6/2013 | Castagnetti et al. | |
| 2015/0220135 A1 | 8/2015 | Huang et al. | |
| 2015/0261250 A1* | 9/2015 | Jung | G06F 1/08 713/501 |
| 2016/0247567 A1* | 8/2016 | Ikegami | G11C 11/1697 |

* cited by examiner

*Primary Examiner* — Stefan Stoynov

(57) ABSTRACT

One embodiment relates to a method of saving power in a memory subsystem. A first procedure is performed to save memory controller power by changing a clock toggle rate, and a second procedure is performed to save memory subsystem power by changing a clock frequency for the memory subsystem. A third procedure is performed to rebound back to full speed. Another embodiment relates to a memory subsystem which includes a memory controller, a memory, and a physical input/output interface. The memory controller performs at least a first procedure to save memory controller power by changing a clock toggle rate. Other embodiments and features are also disclosed.

17 Claims, 6 Drawing Sheets

APPARATUS AND METHOD TO REDUCE MEMORY SUBSYSTEM POWER DYNAMICALLY

BACKGROUND

Technical Field

The present disclosure relates generally to the electronic circuits and, more particularly, to memory subsystems and memory controllers.

Description of the Background Art

A conventional memory controller for dynamic random access memory (DRAM) typically includes a single shared queue that holds, or multiple dedicated queues that hold, a list of memory access (read and write) commands. An ordering engine may be used to reorder the commands for user-assigned priority and increased bandwidth while maintaining coherency.

The depth of the queue(s) may be designed or chosen based on a bandwidth saturation and latency study during an architecture exploration phase. The queue depth(s) may be selected to provide optimum performance under heavy load traffic conditions.

SUMMARY

One embodiment relates to a method of saving power in a memory subsystem. A first procedure is performed to save memory controller power by changing a clock toggle rate, and a second procedure is performed to save memory subsystem power by changing a clock frequency for the memory subsystem. A third procedure is performed to rebound back to full speed.

Another embodiment relates to a memory subsystem which includes a memory controller, a memory, and a physical input/output interface. The memory controller performs at least a first procedure to save memory controller power by changing a clock toggle rate.

Other embodiments and features are also disclosed.

DETAILED DESCRIPTION

Modern DRAM protocols are introducing low-power features. Such low-power features include changing the input clock frequency during power-down and refresh modes.

The present disclosure provides methods and apparatus for reducing power consumption of a memory controller (MC) or a memory subsystem. The memory subsystem may include the MC, the physical input/output layer (i.e. the PHY layer), and the DRAM device(s). The power consumption may be reduced though dynamic power down and/or frequency switching.

The dynamic power down and frequency switching may be performed when a lower level of workload is detected. Before the dynamic power down and frequency switching, the memory controller or memory subsystem may be in a higher-speed mode. After the dynamic power down and frequency switching, the memory controller or memory subsystem may be in a lower-speed mode.

In accordance with an embodiment of the invention, the dynamic power down and frequency switching may be scheduled opportunistically during run-time by a scheduling logic hardware circuit. In an exemplary implementation, the scheduling logic hardware circuit may operate as a queue-aware operating frequency switching apparatus with fast turn-back/rebound to full-speed mode. The fast turn-back/rebound may be performed when back-pressure is detected in the lower-rate mode.

Figure 1:
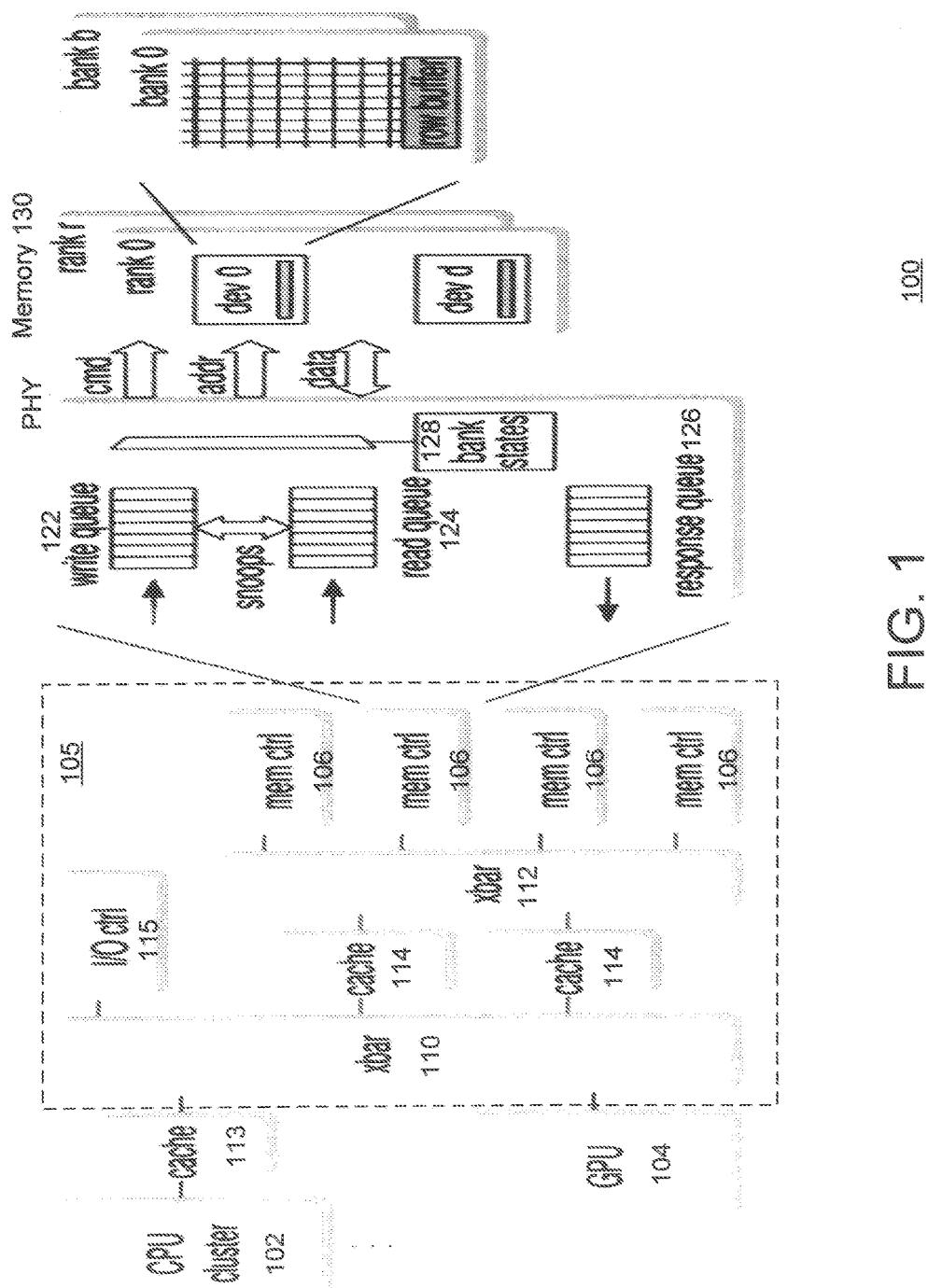
FIG. 1 depicts an exemplary structure of a system that includes a multiple-channel memory controller.

FIG. 1 depicts an exemplary implementation of a memory subsystem 100 that includes a multiple-channel memory controller 105. As depicted, multiple central processing units (CPUs) in a CPU cluster 102 and/or a graphic processing unit (GPU) 104 may access the multiple-channel memory controller 105. The multiple-channel memory controller 105 may utilize an input/output (I/O) controller 115 to control cross-bar (xbar) switches 110 and 112. To improve performance, a cache 113 may be utilized between the CPU cluster 102 and the xbar switch 110, and caches 114 may also be utilized between the xbar switches 110 and 112.

As depicted in FIG. 1, each channel may be controlled by a memory controller (mem ctrl) 106 that utilizes a write queue 122 for write commands, a read queue 124 for read commands, and a response queue 126 for responses to the commands. Snooping (snoops) circuitry may be used to determine the state of fullness of the write and read queues.

Each memory controller 106 also utilizes bank state information 128 to generate commands (cmd) and addresses (addr) to write data to, and read data from, the memory 130. As depicted, the memory 130 may be organized in ranks (i.e. rank 0, rank 1, rank 2, . . . , rank r), each rank including multiple memory devices (dev 0, dev 1, dev 2, . . . , dev d), and each device including multiple banks (bank 0, bank 1, bank 2, . . . , bank b). A physical input/output (PHY) interface 129 may be used to communicate the commands, addresses and data between the memory controller 106 and the devices in the memory 130. A memory subsystem includes a memory controller 106, associated devices in the memory 130, and the PHY interface therebetween.

Figure 2:
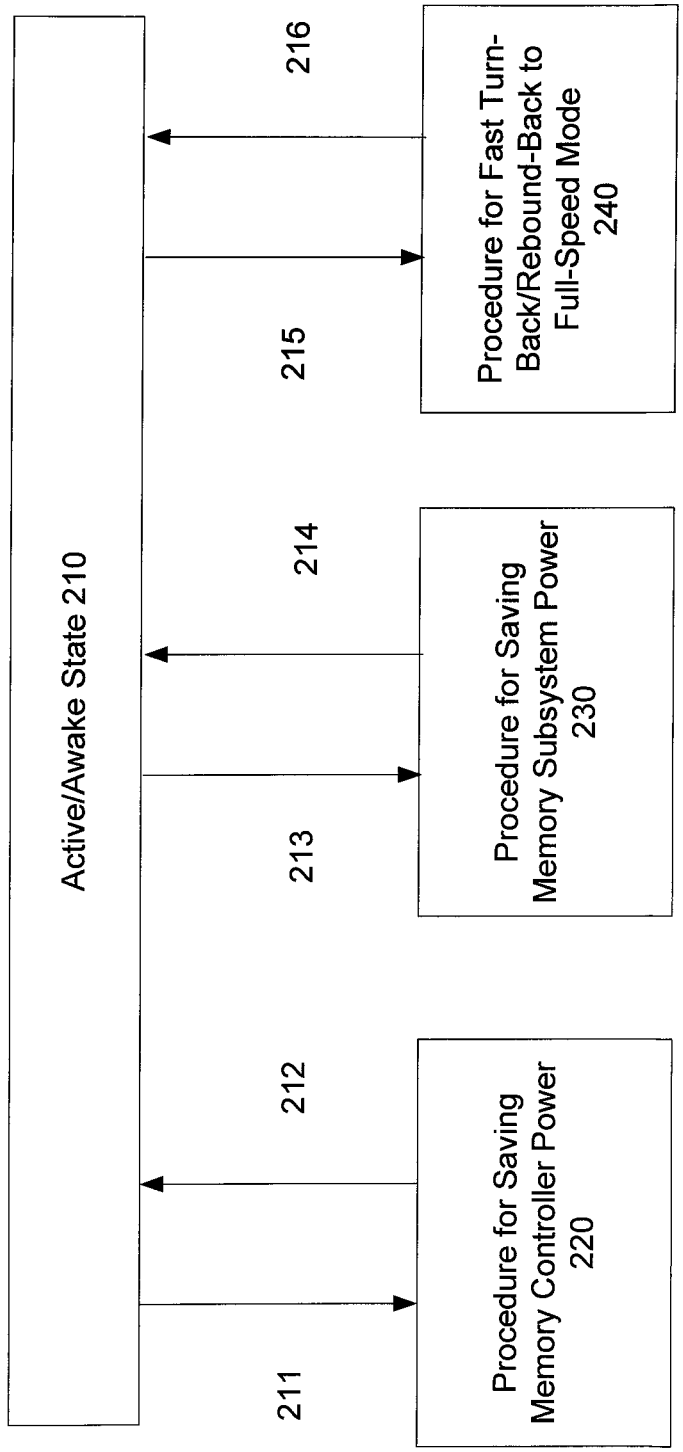
FIG. 2 is a high-level diagram depicting exemplary procedures utilized in relation to an active/awake state of the memory subsystem in accordance with an embodiment of the invention.

FIG. 2 is a high-level diagram depicting exemplary procedures utilized in relation to an active/awake state 210 of the memory subsystem in accordance with an embodiment of the invention. An embodiment of the invention includes three power-saving procedures that may be entered from the active/awake state 210.

A first procedure 220 that may be entered 211 from the active/awake state 210 is a procedure for saving memory controller power. The first procedure 220 dynamically changes the clock toggle rate of a memory controller to save power and is described in further detail below in relation to FIG. 3.

After exiting 212 the first procedure 220 to return to the active/awake state 210, a second procedure 230 may be entered 213. The second procedure 230 is for saving memory subsystem power. When the toggle rate is reduced per the first power-saving procedure 220, the second procedure 230 may, after a configurable grace period, save further power by lowering the clock frequency of the whole memory subsystem. The second procedure 230 is described in further detail below in relation to FIG. 4.

After exiting 214 the second procedure 230 to return to the active/awake state 210, a third procedure 240 may be entered 215. The third procedure 240 is a procedure for fast turn-back/rebound to full-speed mode. When back-pressure is detected in the lower frequency operating mode, the third procedure 240 may rapidly turn-back or rebound back to the full-speed mode to minimize performance degradation. The third procedure 240 is described in further detail below in relation to FIG. 5. Exiting 216 the third procedure 230 returns the memory subsystem again to the active/awake state 210.

Figure 3A:
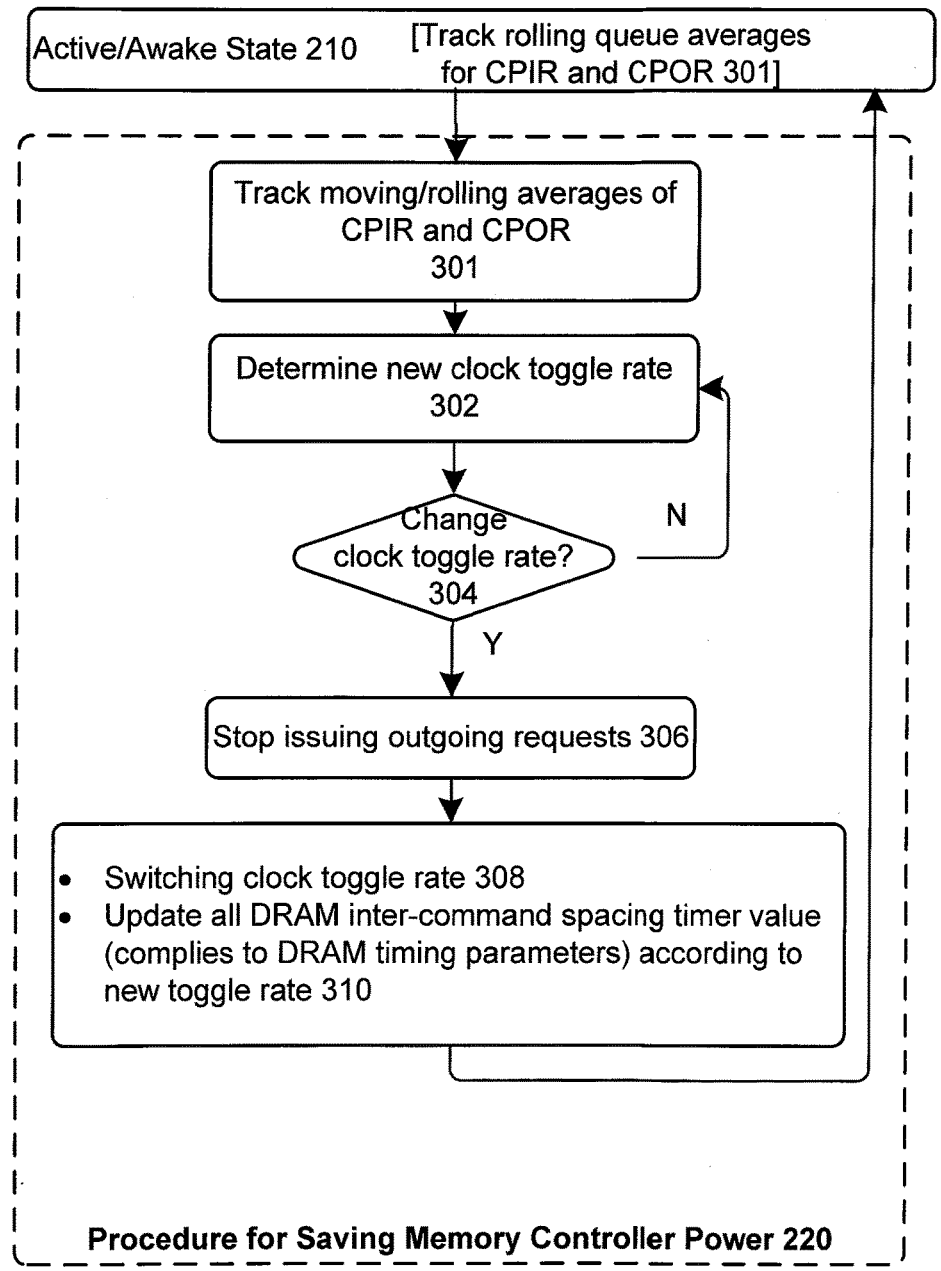
FIG. 3A is a flow chart of an exemplary procedure for saving memory controller power in accordance with an embodiment of the invention.

FIG. 3A is a flow chart of an exemplary procedure 220 for saving memory controller power in accordance with an embodiment of the invention. This first procedure 220 dynamically changes a toggle rate of the operational clock signal to save power. Changing the toggle rate of the operational clock signal effectively changes its operational frequency.

When the memory controller 106 is operating in the active/awake mode 210, moving (in other words, rolling) averages for the number of clock cycles per incoming request (CPIR) and number of clock cycles per outgoing request (CPOR) may be tracked 301. In other words, averages for the CPIR and CPOR may be kept track of on a moving/rolling basis. These moving averages may be determined by snooping the fill status of the write and read queues. Incoming requests may include write and read requests received by the microcontroller, and outgoing requests may include write and read requests sent by the microcontroller to the memory.

As depicted, a first step of the first procedure 220 may involve determining 302 a new clock toggle rate. The determination 302 of the new clock toggle rate may be based on the moving/rolling queue averages for CPIR and CPOR.

When CPOR is greater than CPIR, then the average time to process a command by the memory controller (proportional to CPOR) is greater than the average time for receiving a user-supplied command (proportional to CPIR). In other words, the egress rate is slower than the ingress rate, such that the queues of the memory controller are building up (becoming congested). In this case, the frequency of the operational clock signal may be effectively maintained by using a full clock toggle rate (i.e. reducing the clock toggle rate is prohibited).

On the other hand, when CPOR is less than CPIR, then the average time to process a command by the memory controller (proportional to CPOR) is less than the average time for receiving a user-supplied command (proportional to CPIR). In other words, the egress rate is faster than the ingress rate, such that the queues of the memory controller are depleting (becoming emptier). In this case, the frequency of the operational clock signal may be effectively reduced by using a reduced clock toggle rate.

The amount of reduction of the clock toggle rate may depend upon the relative values of CPOR and CPIR. In an exemplary implementation, the reduced toggle rate may be set to one divided by the rounded down value of the ratio of the egress speed to the ingress speed. The egress speed is proportional to 1/CPOR, and the ingress speed is proportional to 1/CPIR. Hence, the ratio of the egress speed to the ingress speed is CPIR/CPOR. Thus, the reduced toggle rate may be set to the rounded down value of CPIR/CPOR.

In particular, when CPIR is less than two times CPOR (CPIR/CPOR<2), then the operational clock signal may still be output using a clock toggle rate at the full toggle rate. When CPIR is greater than or equal to two times CPOR but less than three times CPOR (3>CPIR/CPOR≥2), then the operational clock signal may be output using a clock toggle rate at one-half (½) of the full toggle rate. When CPIR is greater than or equal to three times CPOR but less than four times CPOR (4>CPIR/CPOR≥3), then the operational clock signal may be output using a clock toggle rate at one-third (⅓) of the full toggle rate. When CPIR is greater than or equal to four times CPOR but less than five times CPOR (5>CPIR/CPOR≥4), then the operational clock signal may be output using a clock toggle rate at one-fourth (¼) of the full toggle rate. And so on.

Table 1 below illustrates examples of different clock toggle rates based on various moving/rolling queue averages for CPIR and CPOR. The clock toggle rates in the table are determined using the scheme of the above-described exemplary implementation.

TABLE 1

| Moving/rolling average clocks per incoming request (CPIR) | Moving/rolling average clocks per outgoing request (CPOR) | New Operating Frequency based on moving/rolling average CPIR and CPOR |
| --- | --- | --- |
| 4 | 6 | Full toggle rate |
| 17 | 8 | ½ toggle rate |
| 30 | 9 | ⅓ toggle rate |
| 41 | 10 | ¼ toggle rate |
| 38 | 7 | ⅕ toggle rate |
| 37 | 6 | ⅙ toggle rate |
| 59 | 8 | ⅐ toggle rate |
| 77 | 9 | ⅛ toggle rate |

The procedure 220 continues to determine the new clock toggle rate per step 302 until it is determined per step 304 that the clock toggle rate is to be changed. If the new clock toggle rate is different from the current toggle rate, then it is determined 304 that the clock toggle rate is to be changed. (If the new clock toggle rate is the same as the current toggle rate, then it is determined 304 that the clock toggle rate does not need to be changed.)

After the determination 304 is made that the clock toggle rate is to be changed, the issuance of outgoing requests is stopped 306. Thereafter, the clock toggle rate is switched 308 to the new clock toggle rate. The new clock toggle rate may be achieved as follows.

When the new clock toggle rate is the full toggle rate, then a clock enable (EN) signal provided to a clock gating unit is asserted every clock cycle. When the new clock toggle rate is one-half (½) the full toggle rate, then the clock enable signal provided to the clock gating unit is asserted every 2 clock cycles. When the new clock toggle rate is one-third (⅓) the full toggle rate, then the clock enable signal provided to the clock gating unit is asserted every 3 clock cycles. When the new clock toggle rate is one-fourth (¼) the full toggle rate, then the clock enable signal provided to the clock gating unit is asserted every 4 clock cycles. And so on.

More generally, when the new clock toggle rate is at 1/N times the full toggle rate, then the clock enable signal provided to the clock gating unit is asserted every N clock cycles. This produces a clock (CLK) signal having an effective frequency of 1/N times the base frequency.

Figure 3B:
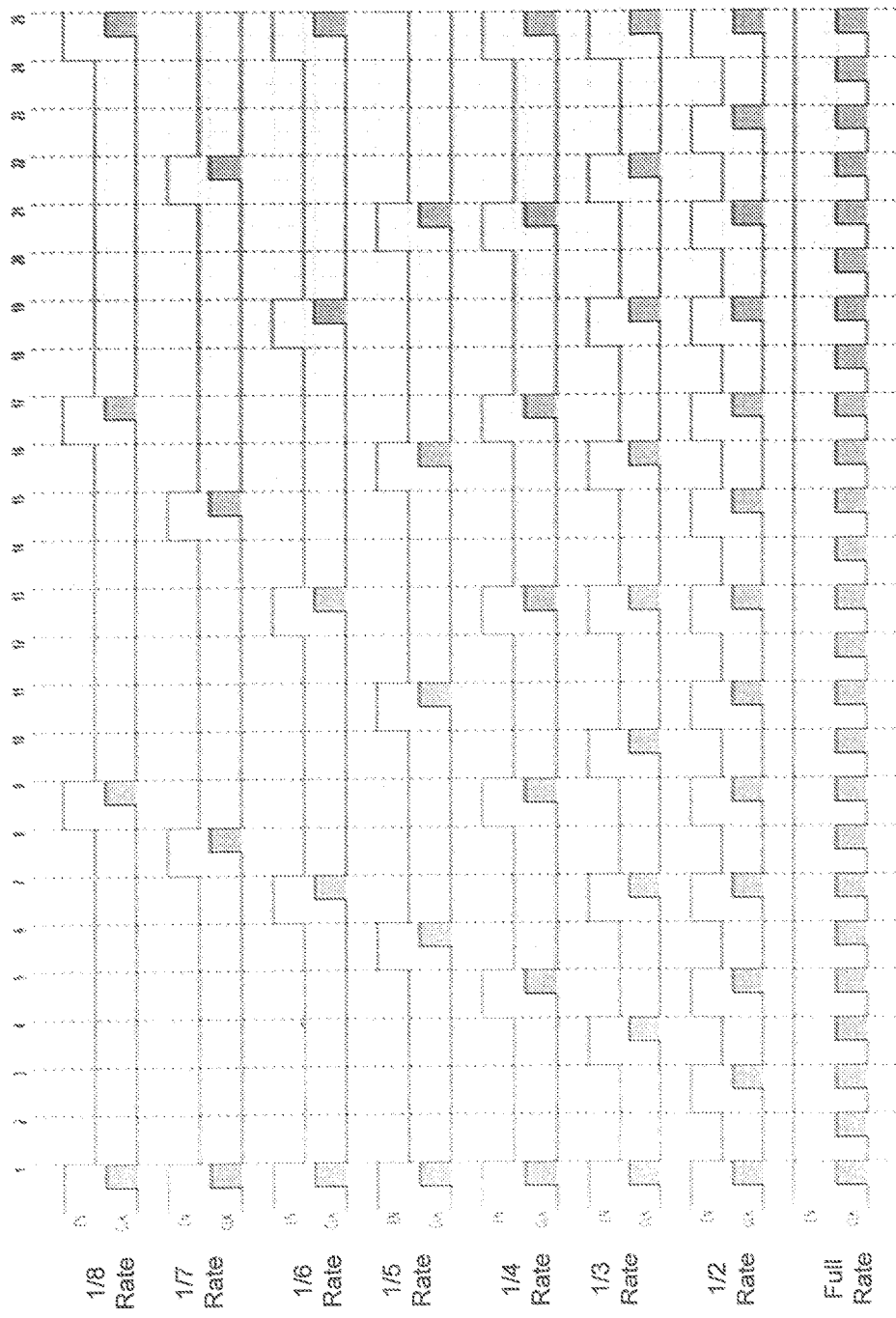
FIG. 3B shows timing diagrams for a clock enable signal and a resultant clock signal for various clock toggle rates in accordance with an embodiment of the invention.

Clock enable (EN) and resultant clock (CLK) signals for various toggle rates are depicted in FIG. 3B. The "Full Rate" timing diagram shows the EN and CLK signals when the clock toggle rate is at the full toggle rate. The "½ Rate" timing diagram shows the EN and CLK signals when the clock toggle rate is at one-half of the full toggle rate. The "⅓ Rate" timing diagram shows the EN and CLK signals when the clock toggle rate is at one-third of the full toggle rate. The "¼ Rate" timing diagram shows the EN and CLK signals when the clock toggle rate is at one-fourth of the full toggle rate. The "⅕ Rate" timing diagram shows the EN and CLK signals when the clock toggle rate is at one-fifth of the full toggle rate. The "⅙ Rate" timing diagram shows the EN and CLK signals when the clock toggle rate is at one-sixth of the full toggle rate. The "⅐ Rate" timing diagram shows the EN and CLK signals when the clock toggle rate is at one-seventh of the full toggle rate. The "⅛ Rate" timing diagram shows the EN and CLK signals when the clock toggle rate is at one-eighth of the full toggle rate.

After switching 308 the clock toggle rate in FIG. 3A, all DRAM inter-command spacing timer values may be updated 310. The update 310 is according to the new clock toggle rate so that the DRAM inter-command spacing timer values comply with DRAM timing parameters.

In one implementation, those DRAM timing parameters that are specified in units of time (for example, in nanoseconds) are scaled to units of clocks. For example, consider an activate-to-activate command period, $t_{RC}$, of 48 nanoseconds and a clock frequency, $f_{CK}$, of 1 GHz. In this case, the value for $t_{RC}$ is 48 (i.e. 48 clock cycles or 48 $t_{CK}$). Any non-whole number is rounded-up to the next integer. For example, when the memory controller operates in the ½ Rate (half of the full toggle rate) mode, then the $t_{RC}$ value will be updated to 24. In another example, when the memory controller operates in the ⅛ Rate (half of the full toggle rate) mode, then the $t_{RC}$ value will be updated to 6.

After the update 310 of the DRAM inter-command spacing timer values, the control may return control from the procedure 220 to the active/awake state 210 (in which issuance of outgoing requests resumes).

In one implementation, the logic for determining the moving/rolling queue averages may use add-and-logical right shift by 2 operations. In addition, whenever the clock toggle rate changed, the moving/rolling average CPIR and CPOR counters are reset. Furthermore, note that the apparatus for reducing memory subsystem power stops operating during any power-saving modes, including power-down, self-refresh, maximum power saving mode, deep power down, and so on.

In accordance with the embodiment of the invention, since the clock cycle period time remains the same with different clock toggle rates, so there is advantageously no need to have a rate matcher to compensate for frequency differences between the core logic and memory controller and/or between the memory controller and the physical interface (PHY) logic.

Figure 4:
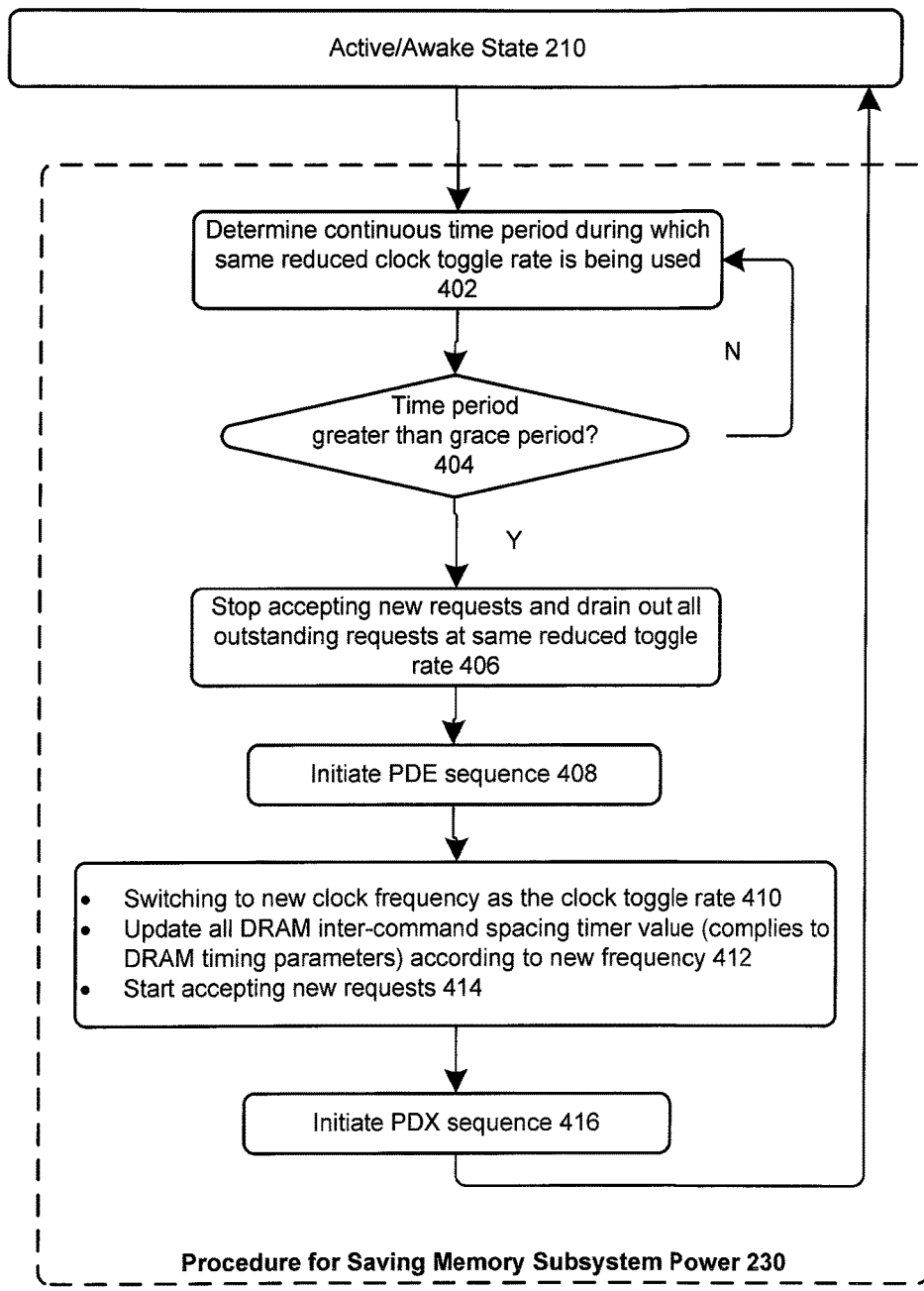
FIG. 4 is a flow chart of an exemplary procedure for saving memory subsystem power in accordance with an embodiment of the invention.

FIG. 4 is a flow chart of an exemplary procedure 230 for saving memory subsystem power in accordance with an embodiment of the invention. This second procedure 230 may be utilized after the clock toggle rate is switched to a reduced clock toggle rate by the first procedure 220.

As depicted, a determination 402 may be made as to the continuous time period during which the same reduced toggle rate is being used. For example, if the clock toggle rate is changed from an original full rate to a new half rate by the first procedure 220, the determination 402 monitors how long the toggle rate is at that half rate (without any change to the toggle rate).

The time period so determined 402 may be compared 404 against a grace period, which may be configurable. For example, the grace period may correspond to one minute. If the time period is greater than the grace period (i.e. upon expiration of the grace period), then the procedure 230 moves forward to the next step which stops 406 acceptance of new requests and continues operation to drain out all outstanding requests at the same reduced clock toggle rate.

When the outstanding requests are drained out, then the power-down entry (PDE) sequence may be initiated 408. The PDE sequence puts idle DRAM devices into power-down prior to changing to a new clock frequency.

Thereafter, the whole memory subsystem may switch 410 to a new clock frequency that corresponds to the reduced clock toggle rate. In particular, the new clock frequency is the base (full-rate) clock frequency multiplied by the ratio of the reduced clock toggle rate to the full clock toggle rate. For example, if the base clock frequency is 1 GHz, and the reduced clock toggle rate is ⅛ the full rate, then the new (reduced) clock frequency is 125 MHz.

The memory subsystem includes the memory controller, associated DRAM devices in the memory, and the PHY interface therebetween. Switching to the new (reduced) clock frequency advantageously saves power in the DRAM devices and the PHY interface, in addition to the power savings in the memory controller.

In addition, all DRAM inter-command spacing timer values may be updated 412 according to the new clock frequency. The update 412 is according to the new clock frequency so that the DRAM inter-command spacing timer values comply with DRAM timing parameters. After the update 412 of the DRAM inter-command spacing timer values, acceptance of new requests may be started 414.

Thereafter, when a new command is detected in the queue, the memory controller may initiate (trigger) 416 the power-down exit (PDX) sequence. The PDX sequence wakes the DRAM devices to put them back to an active mode.

Alternatively, triggering 416 the PDX sequence may be delayed until accumulated low-priority quests exceed a "wakeup watermark" level, which may be configurable. For example, the wakeup watermark level may be the halfway full level for the queue. This advantageously delays the wakeup in the case where long idles exist between sporadic low-priority memory access requests (i.e. in the case with long gaps between discontinuous low-priority requests), so as to keep the DRAM devices in low power mode for a longer period of time. On the other hand, the PDX sequence may be immediately triggered upon receipt of a high-priority request.

After triggering 416 the PDX sequence, control may return control from the procedure 230 to the active/awake state 210.

Note that frequency switching latency may be effectively hidden by using a deeper/larger queue. For example, for the high-bandwidth memory (HBM) standard protocol, the minimum reactivation latency will be $t_{PD}+t_{XP}=13.125$ nanoseconds, or about 14 $t_{CK}$ for a 1 GHz device, where $t_{PD}$ is the time period between triggering power-down entry and triggering power-down exit, $t_{XP}$ is the time period to exit power-down, and $t_{CK}$ is a clock cycle (at base frequency). In this example, the queue would need to be at least 14 entries deep to effectively hide the frequency switching latency.

Figure 5:
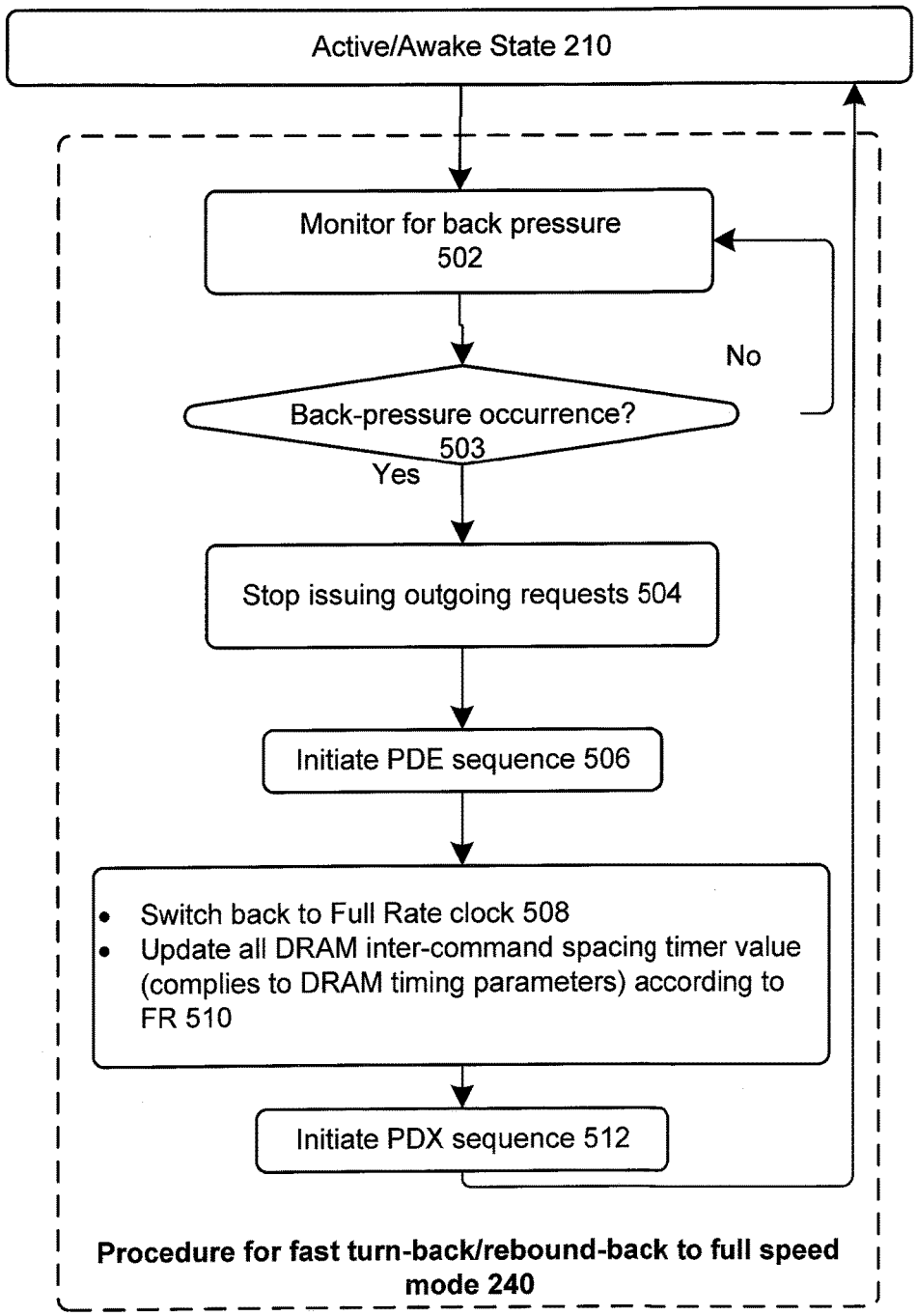
FIG. 5 is a flow chart of an exemplary procedure for fast turn-back/rebound-back to full speed mode in accordance with an embodiment of the invention.

FIG. 5 is a flow chart of an exemplary procedure 240 for fast turn-back/rebound-back to full speed mode in accordance with an embodiment of the invention. This third procedure 240 may be utilized after the clock frequency for the memory subsystem is switched to a reduced frequency (lower frequency mode) by the second procedure 230.

The memory controller monitors 502 the queues of its memory subsystem for the occurrence of back pressure (due to a full queue condition). When back-pressure occurrence is detected 503, then the issuance of outgoing requests is stopped 504. Thereafter, the power-down entry (PDE) sequence may be initiated 506.

Thereafter, the whole memory subsystem may switch back 508 to the full-rate (base) clock frequency. In addition, all DRAM inter-command spacing timer values may be updated 510 according to the new clock frequency. The update 510 is according to the new clock frequency so that the DRAM inter-command spacing timer values comply with DRAM timing parameters.

Thereafter, the memory controller may initiate (trigger) 512 the power-down exit (PDX) sequence. The PDX sequence wakes the DRAM devices to put them back to an active mode. After triggering 512 the PDX sequence, control may return control from the procedure 240 to the active/awake state 210.

Conclusion

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A memory subsystem comprising:
   a memory controller;
   a memory comprising a plurality of memory devices; and
   a physical input/output interface for communicating commands and addresses from the memory controller to the memory and transferring data between the memory controller and the memory, wherein the memory controller performs a first procedure to save memory controller power by changing a clock toggle rate, wherein the first procedure tracks a first moving average of clock cycles per incoming request and a second moving average of clock cycles per outgoing request and the memory controller performs a second procedure to save memory subsystem power by changing a clock frequency for the memory subsystem.

2. The memory subsystem of claim 1, wherein the first procedure determines a new clock toggle rate based on the first and second moving averages.

3. The memory subsystem of claim 2, wherein the new clock toggle rate is determined to be a rounded-down value of the first moving average divided by the second moving average.

4. The memory subsystem of claim 1, wherein, before changing the clock toggle rate, the memory controller stops issuing outgoing requests.

5. The memory subsystem of claim 1, wherein, after changing the clock toggle rate, the memory controller updates inter-command spacing timer values.

6. The memory subsystem of claim 1, wherein the second procedure determines a time period during which a new clock toggle rate is being used by the memory controller.

7. The memory subsystem of claim 6, wherein the second procedure changes the clock frequency for the memory subsystem when the time period exceeds a grace period.

8. The memory subsystem of claim 1, wherein, before changing the clock frequency, the memory controller stops accepting new requests, continues operation until all outstanding requests are drained out.

9. The memory subsystem of claim 1, wherein, after changing the clock frequency, the memory controller updates inter-command spacing timer values.

10. The memory subsystem of claim 1, wherein the memory controller performs a third procedure to rebound back to full speed.

11. The memory subsystem of claim 10, wherein the third procedure monitors for back pressure, and switches back to a full-rate clock frequency and a full-rate clock toggle rate after detecting back pressure.

12. A method of saving power in a memory subsystem, the method comprising:
   performing a first procedure by a memory controller to save memory controller power by changing a clock toggle rate, wherein the first procedure tracks a first moving average of clock cycles per incoming request and a second moving average of clock cycles per outgoing request, and wherein the first procedure determines a new clock toggle rate based on the first and second moving averages;
   performing a second procedure by the memory controller to save memory subsystem power by changing a clock frequency for the memory subsystem; and
   performing a third procedure to rebound back to full speed.

13. The method of claim 12, wherein the new clock toggle rate is determined to be a rounded-down value of the first moving average divided by the second moving average.

14. The method of claim 12, wherein, before changing the clock toggle rate, the memory controller stops issuing outgoing requests, and wherein, after changing the clock toggle rate, the memory controller updates inter-command spacing timer values.

15. The method of claim 12, wherein the second procedure determines a time period during which a new clock toggle rate is being used by the memory controller and changes the clock frequency for the memory subsystem when the time period exceeds a grace period.

16. The method of claim 12, wherein, before changing the clock frequency, the memory controller stops accepting new requests, continues operation until all outstanding requests are drained out, and wherein, after changing the clock frequency, the memory controller updates inter-command spacing timer values.

17. The method of claim 12, wherein the third procedure monitors for back pressure, and switches back to a full-rate clock frequency and a full-rate clock toggle rate after detecting back pressure.

* * * * *